United States Patent [19]

Lee

[11] Patent Number: 5,279,771
[45] Date of Patent: Jan. 18, 1994

[54] STRIPPING COMPOSITIONS COMPRISING HYDROXYLAMINE AND ALKANOLAMINE

[75] Inventor: Wai M. Lee, Milpitas, Calif.

[73] Assignee: EKC Technology, Inc., Hayward, Calif.

[21] Appl. No.: 610,044

[22] Filed: Nov. 5, 1990

[51] Int. Cl.$^5$ .................. C11D 3/30; C11D 7/32; C11D 7/26; C11D 7/50
[52] U.S. Cl. .................. 252/548; 252/156; 252/158; 252/DIG. 8; 134/38; 204/146
[58] Field of Search ............... 252/548, 156, 158, 162, 252/DIG. 8; DIG; 134/38; 204/146

[56] References Cited

U.S. PATENT DOCUMENTS

| | | | |
|---|---|---|---|
| 3,615,825 | 10/1971 | Gansser | 134/38 |
| 3,619,390 | 11/1971 | Dillenberg | 204/146 |
| 3,640,810 | 2/1972 | Plasynski et al. | 134/37 |
| 3,914,185 | 10/1975 | Inamorato | 252/546 |
| 3,972,839 | 8/1976 | Murphy | 252/548 |
| 4,111,767 | 9/1978 | Kawagishi et al. | 204/146 |
| 4,268,406 | 5/1981 | O'Brien et al. | 252/525 |
| 4,509,989 | 4/1985 | Sumansky | 252/548 |
| 4,786,578 | 11/1988 | Neisius et al. | 430/256 |
| 4,929,301 | 5/1990 | Beechko | 156/657 |
| 4,941,941 | 7/1990 | Austin et al. | 156/647 |

*Primary Examiner*—Paul Lieberman
*Assistant Examiner*—Erin Higgins
*Attorney, Agent, or Firm*—Breiner & Breiner

[57] ABSTRACT

A stripping composition for removing resists from substrates containing hydroxylamine and at least one alkanolamine is described. Optionally, one or more polar solvents can also be included in the stripping composition. The stripping composition is especially suitable for removing a photoresist from a substrate during the manufacture of semiconductor integrated circuits and for removing cured polymer coatings, such as polyimide coatings.

9 Claims, No Drawings

STRIPPING COMPOSITIONS COMPRISING HYDROXYLAMINE AND ALKANOLAMINE

FIELD OF THE INVENTION

The present invention is directed to a stripping composition comprising hydroxylamine and at least one alkanolamine for removing resists, such as photoresists or other polymeric layers, from a substrate. One or more polar solvents can additionally be included in the stripping composition. The stripping composition is especially suitable for removing a photoresist from a substrate during the manufacture of semiconductor integrated circuits and the removal of cured polymer coatings from a substrate, such as a polyimide coating, without damaging the substrate.

BACKGROUND OF THE INVENTION

During the fabrication of microcircuits, the precise positioning of a number of appropriately doped regions on a slice of semiconductor is required followed by the positioning of one or more interconnection patterns on the semiconductor. Positive-type resists have been extensively used as masking materials to delineate patterns onto a substrate so that the patterns can be subsequently etched or otherwise defined into the substrate. The final step in preparing the substrate then involves removing the unexposed resist material from the substrate. Increasingly, however, plasma etching, reactive ion etching or ion milling is used to define the pattern in a substrate which renders the resist mask substantially impossible to remove by stripping agents containing one or more of the following solvents: halogenated hydrocarbons such as, for example, methylene chloride or tetrachloroethylene; amines and their derivatives such as, for example, dimethylformamide, dimethylacetamide, pyrrolidone, diethanolamine, and triethanolamine; glycol ethers, such as, for example, ethylene glycol monoethyl ether, 2-butoxyethanol, and 2-(butoxyethoxy)ethanol; and alkylsulfone, such as, for example, dimethylsulfone.

Additionally, during such etching processing, an organometallic compound is formed as a sidewall polymeric material. The above-mentioned solvents are also ineffective in removing this sidewall organometallic polymer. A recently developed technique effective for photoresist removal is plasma oxidation, also known as plasma ashing. However, while this process is effective for removing a photoresist, it is not effective for removing the sidewall organometallic polymer formed during the etching process.

Further, polyimides are increasingly used in microelectronics as fabrication aids, passivants, and interlevel insulators. The use of a polyimide as a fabrication aid includes application of the polyimide as a photoresist, planarization layer in a multi-level photoresist scheme and as an ion implant mask. In these applications, the polymer is applied to a wafer or substrate, subsequently cured or patterned by a suitable method and removed after use. Many conventional strippers are not sufficiently effective in removing the polyimide layer once the polyimide has been subjected to a severe curing operation. The removal of such polyimides is normally accomplished by boiling the substrate in hydrazine or in an oxygen plasma.

OBJECTS OF THE INVENTION

Accordingly, a primary object of the present invention is to provide a stripping composition comprising hydroxylamine and at least one alkanolamine for removing a resist from a substrate and a method of using the composition.

A further primary object of the present invention is to provide a stripping composition comprising hydroxylamine, at least one alkanolamine and at least one polar solvent for removing a resist from a substrate and a method of using the composition.

A further primary object of the present invention is to provide a stripping composition for removing a photoresist material from a substrate during the manufacture of a semiconductor integrated circuit without causing damage to the substrate or adversely affecting or hindering subsequent operation or process steps.

A further primary object of the present invention is to provide a stripping composition for removing a cured polymer resist from a substrate, in particular a partially or fully cured polyimide coating, without damaging the substrate.

A further primary object of the present invention is to provide a stripping composition for removing organometallic polymers from a substrate formed during plasma etching processes involving the substrate.

BRIEF DESCRIPTION OF THE INVENTION

The present invention is directed to a stripping composition containing hydroxylamine and at least one alkanolamine which is miscible with the hydroxylamine. Further, the stripping composition can optionally contain one or more polar solvents. The addition of a polar solvent strengthens the effectiveness of the stripping composition. The stripping compositions allow for the clean removal of a resist from a substrate.

The stripping compositions of the present invention are particularly suitable for removing a photoresist material from a substrate, in particular, during the manufacture of a semiconductor integrated circuit without adversely affecting or hindering subsequent manufacturing operation or process steps.

Further, the stripping compositions of the present invention are suitable for removing cured polymer resists from a substrate, such as a partially or fully cured polyimide coating, and for removing organometallic polymers formed on a substrate during plasma etching processes.

The method of removing a resist from a substrate using the stripping compositions of the present invention involves contacting the resist with the stripping composition at a temperature and for a time sufficient to remove the particular resist present.

DESCRIPTION OF THE PRESENTLY PREFERRED EMBODIMENT

The stripping composition of the present invention contains hydroxylamine, at least one alkanolamine, and, optionally, at least one polar solvent. The stripping compositions exhibit synergistic stripping properties suitable for removing resists, such as photoresists including those which have been treated in a plasma etching environment and cured polymer resists such as polyimide coatings. Additionally, the stripping compositions are suitable for removing organometallic polymers formed on a substrate during plasma etching processes.

The stripping composition preferably contains at least about 5% by weight of hydroxylamine and at least about 10% by weight of at least one alkanolamine. Optionally, the stripping composition also contains preferably from about 5%–85% by weight of at least one polar solvent.

The hydroxylamine suitable for use in the present invention has the molecular structure $NH_2OH$.

The alkanolamines suitable for use in the present invention are miscible with the hydroxylamine and are preferably water-soluble. Additionally, the alkanolamines useful in the present invention preferably have relatively high boiling points, such as for example 100° C. or above, and a high flash point, such as for example 150° F. or above. Suitable alkanolamines are primary, secondary or tertiary amines and are preferably monoamines, diamines or triamines, and, most preferably, monoamines. The alkanol group of the amines preferably has from 1 to 5 carbon atoms.

Preferred alkanolamines suitable for use in the present invention can be represented by the chemical formula $R_1R_2-N-CH_2CH_2-O-R_3$ wherein $R_1$ and $R_2$ can be H, $CH_3$, $CH_3CH_2$ or $CH_2CH_2OH$ and $R_3$ is $CH_2CH_2OH$.

Examples of suitable alkanolamines include monoethanolamine, diethanolamine, triethanolamine, tertiarybutyldiethanolamine isopropanolamine, 2-amino-1-propanol, 3-amino-1-propanol, isobutanolamine, 2-amino-(2-ethoxyethanol), and 2-amino(2-ethoxy)-propanol.

Polar solvents suitable for use in the present invention include ethylene glycol, ethylene glycol alkyl ether, diethylene glycol alkyl ether, triethylene glycol alkyl ether, propylene glyol, propylene glycol alkyl ether, dipropylene glycol alkyl ether, tripropylene glycol alkyl ether, N-substituted pyrrolidone, ethylenediamine, and ethylenetriamine. Additional polar solvents as known in the art can also be used in the composition of the present invention.

The stripping compositions of the present composition are effective in removing a wide range of positive photoresists but are particularly useful in removing photoresists commonly consisting of an ortho-naphthoquinone diazide sulfonic acid ester or amide sensitizer with novolak-type binders or resins. Examples of commercially available photoresist compositions which the stripping compositions of the present invention effectively remove from a substrate include K.T.I. photoresists 820, 825; Philip A. Hunt Chemical Corp. Waycoat HPR 104, HPR 106, HPR 204 and HPR 206 photoresists; Shipley Company, Inc. photoresists of the AZ-1300 series, AZ-1400 series and AZ-2400 series; and Tokyo Ohka Kogyo Co., Ltd. photoresist OFPR-800.

Further, the stripping compositions of the present invention are effective in removing polyimide coatings from substrates even when the polyimide coatings have been subjected to a high temperature cure, including a cure performed at a temperature as high as about 400° C. Examples of commercially available polyimide compositions which the stripping compositions of the present invention effectively remove from a substrate includes Ciba Geigy Proimide 293, Asahi G-6246-S, and DuPont PI2545 and PI2555.

Examples of substrates from which the stripping compositions of the present invention remove photoresists without attacking the substrates themselves include metal substrates such as aluminum, titanium/tungsten, aluminum/-silicon, aluminum/silicon/copper; and substrates such as silicon oxide, silicon nitride, and gallium/arsenide.

The method of removing a resist or other material from a substrate using the stripping compositions of the present invention involves contacting a substrate having a resist thereon with a stripping composition of the present invention for a time and at a temperature sufficient to remove the resist. The time and temperature are determined based on the particular material being removed from a substrate. Generally, the temperature is in the range of from about 50° C. to 150° C. and the contact time is from about 2 to 30 minutes.

Examples illustrating the removal of a resist from a substrate under varying conditions using the stripping compositions of the present invention are described further below. The following examples are provided to further illustrate the present invention and are not intended to limit the scope of the present invention.

Examples of stripping compositions according to the present invention suitable for removing a resist from a substrate are set forth in Table I below.

TABLE I

| Stripping Composition | Hydroxylamine Wt. % | Alkanolamine Wt. % | Solvent Wt. % |
|---|---|---|---|
| A | 10% | 90% 2-Ethoxy-2-Amino Ethanol | 0% |
| B | 50% | 50% 2-Ethoxy-2-Amino Ethanol | 0% |
| C | 10% | 45% 2-Ethoxy-2-Amino Ethanol | 45% N-Methyl-2-Pyrrolidone |
| D | 10% | 45% Diethanolamine | 45% N-Methyl-2-Pyrrolidone |
| E | 50% | 50% Diethanolamine | 0% |
| F | 20% | 30% Diethanolamine | 50% Dipropyleneglycol Ethyl Ether |
| G | 35% | 35% Diethanolamine | 30% Diethyleneglycol Butyl Ether |
| H | 35% | 50% 2-Ethoxy-2-Amino Ethanol | 15% Triethyleneglycol Butyl Ether |
| I | 25% | 25% Tertiary Butyldiethanolamine | 50% N-Methyl-2-Pyrrolidone |
| J | 50% | 25% 2-Ethoxy-2-Amino Ethanol | 25% Diethylenetriamine |
| K | 25% | 50% 2-Ethoxy-2-Amino Ethanol | 25% Diethylenetriamine |

EXAMPLE 1

Example 1 illustrates the removal of a photoresist from a substrate using different stripping compositions of the present invention. The substrate is treated in a conventional manner prior to the treatment of the substrate with the stripping compositions of the present invention.

More specifically, wafer substrates were spun in a commercially available spinning apparatus with the photoresist K.T.I. 820 at spinning speeds ranging from 1000 to 5000 RPM resulting in the formation of films having a thickness of about 0.5–2.5 microns on the substrate. After thus coating the substrate, the substrate was heated for about 10–20 minutes at 80° C.–90° C. to drive out any traces of solvent from the photoresist. Next, the photoresist was selectively exposed using an image pattern transfer technique as known in the art.

The exposed areas of the positive photoresist were solubilized in a developer solution. After such development, the pattern on the wafer was cleaned using a spray rinse and the wafer hard-baked. Baking temperatures can be in the range of from about 125° C.-200° C. Baking causes the resist to harden and adhere firmly to the surface of the substrate. The final step in the wafer preparation process is the removal of the unexposed positive photoresist material. Removal of this material is performed using stripping compositions of the present invention. Stripping baths were prepared and maintained at a constant temperature in 1000 ml beakers. The hard-baked coated wafers were immersed in the stripping composition contained in the beakers. The contents of the beakers were subjected to intermittent agitation for specified times. After the wafer was removed from the stripping bath, the wafer was rinsed in a cascade of deionized water and spun dry in a spin/rinser dryer. The effectiveness of the stripping operation was judged by the time required for removal of the coating layer and the amount of photoresist residue remaining on the wafer surface following rinsing. Specific examples performed as described above utilizing stripping compositions as set forth in Table I are set forth in Table II below.

TABLE II

| Resist Hard Bake Temp. | Stripping Composition | Bath Temp. | Bath Time (Mins) | Observations |
|---|---|---|---|---|
| 125° C. | A | 65° C. | 10 | Resist dissolved in 3 minutes; Rinsed very cleanly |
| 150° C. | A | 65° C. | 5 | Resist lifted very cleanly from substrate |
| 180° C. | B | 65° C. | 10 | Resist dissolved in 2 minutes; Rinsed clean |
| 150° C. | D | 75° C. | 5 | Resist dissolved in 3 minutes; Rinsed clean |

EXAMPLE 2

Example 2 illustrates the removal of a polyimide resist coating from a substrate using stripping compositions of the present invention. As in Example 1, a conventional coating method was utilized.

More specifically, wafer substrates were coated with Asahi G-6246-S negative imagable polyimide to a thickness of 16 microns. The coated wafers were baked at 250° C. to remove the solvent present in the polyimide. The polyimide coating was then exposed in a Nikon Stepper with a 350mJ dose and developed in the Asahi A-145/C-210 developer. The wafers were then immersed in a bath containing a stripping composition and processed in the stripping bath as described in Example 1 according to the temperatures and times as set forth in Table III below.

TABLE III

| Stripping Composition | Bath Temp. | Bath Time (Min) | Observations |
|---|---|---|---|
| B | 70° C. | 10 | Polyimide dissolved; Rinsed cleanly |
| C | 65° C. | 10 | Polyimide dissolved; Rinsed cleanly |
| E | 75° C. | 10 | Polyimide dissolved after 2 minutes; Rinsed very cleanly |
| I | 65° C. | 10 | Polyimide dissolved; |

TABLE III-continued

| Stripping Composition | Bath Temp. | Bath Time (Min) | Observations |
|---|---|---|---|
| | | | Rinsed very cleanly |

EXAMPLE 3

Example 3 illustrates the removal of a polyimide coating from a substrate having multiple layers of materials thereon.

A coating of Ciba Geigy Proimide 293 was spun onto a 3" Gallium/Arsenide wafer to a thickness of 4 microns. The polyimide coating was fully cured at 400° C for 30 minutes. Silicon oxide was then deposited to a thickness of 1000 Angstrom on the polyimide coated surface. Thereafter, a positive photoresist was applied over the silox surface and a pattern created in the photoresist through the steps of exposure and resist development. The image created was then transferred from the photoresist to the silox surface by etching the silicon oxide using a plasma etching technique as known in the art. The pattern was further transferred to the polyimide layer by etching the photoresist and polyimide simultaneously. This procedure resulted in a pattern which covered all the regions on which no metal film was desired. Thereafter, a titanium/tungsten metal film was deposited over the substrate-polyimide combination. Thus, the metal film contacted the substrate only in those regions where the metal film was required. Finally, the polyimide was removed from the substrate by immersing the treated wafer in a stripping composition of the present invention. The metal film as present in the substrate was not attacked by the stripping composition and the polyimide dissolved and rinsed clearly away from the substrate.

EXAMPLE 4

Example 4 illustrates the degree of metal corrosion present to a metal film when the stripping compositions of the present invention contact such metal film coated substrate for varying time periods.

Aluminum was sputtered onto silicon wafers to a thickness of 6000 Angstroms. The sheet resistance of the metal film on the wafers was measured using a Prometrix VP-10 four point probe prior to treating the wafer with a stripping composition. The wafers were then immersed in stripping composition B or stripping composition C as described in Table I for 10, 15, and 20 minutes. Thereafter, the sheet resistance of the metal film was again measured. The amount of metal corrosion was based on the percentage of change in thickness present with respect to the metal film. The results are set forth in Tables IV and V below.

TABLE IV

| | STRIPPING COMPOSITION B | | |
|---|---|---|---|
| Time (Min) | Rs Initial | Rs Final | Change In Thickness |
| 20 | 47.74 | 48.39 | 1.34% |
| 15 | 47.86 | 48.33 | 0.97% |
| 10 | 47.71 | 47.85 | 0.29% |
| 0 | 38.39 | 38.39 | 0.00% |

TABLE V

| | STRIPPING COMPOSITION C | | |
|---|---|---|---|
| Time (Min) | Rs Initial | Rs Final | Change In Thickness |
| 20 | 47.05 | 47.39 | 0.72% |
| 15 | 47.17 | 47.46 | 0.61% |
| 10 | 47.2 | 47.3 | 0.21% |
| 0 | 47.47 | 47.47 | 0.00% |

As will be apparent to one skilled in the art, various modifications can be made within the scope of the aforesaid description. Such modifications being within the ability of one skilled in the art form a part of the present invention and are embraced by the appended claims.

It is claimed:

1. A composition for the removal of a resist from a substrate, said composition consisting essentially of hydroxylamine and at least one alkanolamine which is miscible with said hydroxylamine wherein said hydroxylamine and said alkanolamine are present in sufficient amounts to remove a resist from a substrate.

2. A composition according to claim 1 wherein said hydroxylamine is present in an amount from about 5%-90% by weight.

3. A composition according to claim 1 wherein said at least one alkanolamine is present in an amount of from about 10%-95% by weight.

4. A composition according to claim 1 further comprising at least one polar solvent.

5. A composition according to claim 4 wherein said at least one polar solvent is present in an amount of from about 5%-85% by weight.

6. A composition according to claim 4 or claim 5 wherein said at least one polar solvent is selected from the group consisting essentially of ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine, and ethylenetriamine.

7. A composition according to claim 1 wherein the alkanol group of said at least one alkanolamine contains from 1 to 5 carbon atoms.

8. A composition according to claim 1 wherein said at least one alkanolamine is selected from a group consisting essentially of monoamines, diamines, and triamines.

9. A composition according to claim 1 wherein said at least one alkanolamine has the formula $R_1R_2-N-CH_2CH_2-O-R_3$ wherein $R_1$ and $R_2$ can be H, $CH_3$, $CH_3CH_2$, or $CH_2CH_2OH$ and $R_3$ is $CH_2CH_2OH$.

* * * * *